United States Patent [19]
Roberts et al.

[11] Patent Number: 5,923,584
[45] Date of Patent: Jul. 13, 1999

[54] DUAL POLY INTEGRATED CIRCUIT INTERCONNECT

[75] Inventors: Martin C. Roberts; Sanh D. Tang, both of Boise, Id.

[73] Assignee: Micron Technology, Inc., Boise, Id.

[21] Appl. No.: 09/134,005

[22] Filed: Aug. 14, 1998

Related U.S. Application Data

[62] Division of application No. 08/390,714, Feb. 17, 1995.

[51] Int. Cl.$^6$ .............................. G11C 13/00; G11C 11/40
[52] U.S. Cl. ........................................ 365/182; 365/185.1
[58] Field of Search ................................ 365/182, 185.1, 365/185.01, 230.01, 189.01

[56] References Cited

U.S. PATENT DOCUMENTS

| | | | |
|---|---|---|---|
| 4,619,037 | 10/1986 | Taguchi et al. | 29/578 |
| 4,902,640 | 2/1990 | Sachitano et al. | 437/57 |
| 4,908,324 | 3/1990 | Nihira et al. | 437/31 |
| 5,109,262 | 4/1992 | Kadota | 365/182 |
| 5,219,793 | 6/1993 | Cooper et al. | 437/195 |
| 5,243,220 | 9/1993 | Shibata et al. | 257/748 |
| 5,245,794 | 9/1993 | Salugsugan | 51/165.74 |
| 5,324,672 | 6/1994 | Anmo et al. | 437/31 |
| 5,479,048 | 12/1995 | Yallup et al. | 257/621 |
| 5,701,036 | 12/1997 | Tang | 257/750 |

*Primary Examiner*—Terrell W. Fears
*Attorney, Agent, or Firm*—Schwegman, Lundberg, Woessner & Kluth, P.A.

[57] ABSTRACT

An electrical interconnect overlying a buried contact region of a substrate is characterized by a deposition of a first polycrystalline silicon layer and the patterning and etching of same to form a via. The via is formed in the first polycrystalline silicon layer to expose the substrate and a second polycrystalline silicon layer is formed in the via to contact the substrate. Portions of the second polycrystalline silicon layer overlying the first polycrystalline silicon layer are removed eliminating any horizontal interface between the two polycrystalline silicon layers. The first polycrystalline silicon layer remaining after the etch is then patterned to form an electrical interconnect.

23 Claims, 9 Drawing Sheets

DUAL POLY INTEGRATED CIRCUIT INTERCONNECT

This application is a divisional of U.S. Ser. No. 08/390,714 filed Feb. 17, 1995.

FIELD OF THE INVENTION

The invention is related to fabrication of a semiconductor, and more particularly to the fabrication of a polycrystalline silicon interconnect.

BACKGROUND ART

In some semiconductor buried contact applications upper 1 and lower 2 polycrystalline silicon layers form an electrical interconnect 3 to a substrate, see FIG. 1A. In the process for forming the electrical interconnect 3 polycrystalline silicon layer 1 is masked to define the electrical interconnect 3. Polysilicon 1, overlying polycrystalline silicon 2, and polycrystalline silicon 2 are etched to form the interconnect according to the mask. Typically a defect can occur along the horizontal interface between the upper 1 and lower 2 polycrystalline silicon layers. In one case the defect degrades the integrity of the electrical contact by preventing etching of the lower polycrystalline silicon layer in areas which are exposed during etching. This polycrystalline silicon which is not etched when intended can bridge between two poly interconnects thereby causing malfunctions in the part.

In one solution a single poly process is used, see FIG. 1B. In the single poly process a single layer of polycrystalline silicon is deposited and masked to form an electrical interconnect 4. However contamination problems occur at the poly/oxide interface during buried contact formation when the single poly process is used. In addition a required hydro-fluoric acid etch thins the gate oxide layer creating a non uniform gate oxide.

In addition when patterning a polycrystalline silicon above a buried contact region, trenching of the substrate and exposure of the buried contact region often occur due to misalignment. Thus a need exists to protect the buried contact from exposure and trenching during gate patterning. In one solution a buried contact cap is used to protect the buried contact region. However a parasitic transistor is formed around the contact cap thereby degrading the performance of the device. In one solution an implant mask has been added to lower contact resistance and eliminate parasitic transistor problems.

Thus a need exits for a method having minimal contamination when forming a polycrystalline silicon interconnect which has integrity within the contact without reflective notching. The method must also retain a conformal gate oxide layer without trenching or exposing the substrate.

SUMMARY OF THE INVENTION

The invention is a method for forming an electrical interconnect, typically of polycrystalline silicon (although amorphous silicon or other electrically conductive materials may be used), overlying a buried contact region of a substrate. A first electrically conductive layer, typically of polycrystalline silicon (poly 1), is deposited to overlie the substrate. The poly 1 is patterned and etched to form a via thereby exposing the substrate. A second electrically conductive layer, typically of polycrystalline silicon (poly 2), is deposited to overlie the substrate and the poly 1 layer. In a first embodiment the poly 2 layer is chemically mechanically planarized to remove the poly 2 layer overlying the poly 1 layer thereby eliminating a horizontal interface between the poly 1 and the poly 2 layers.

In a second embodiment a layer resistant to a polycrystalline silicon etch is created prior to the patterning and etch of the poly 1 layer and prior to the deposition of the poly 2 layer. This layer will be referred to as a first polycrystalline silicon etch stop layer or just first etch stop layer. The first etch stop layer is patterned and etched to expose the poly 1 in the buried contact region. The poly 1 layer is then etched to expose the buried contact region of the substrate and poly 2 is deposited to overlie the remaining first etch stop layer and buried contact region. The poly 2 is then removed to expose the etch stop layer. Poly 2 remains in the via.

At this juncture a layer which is capable of reacting with silicon to form a silicon etch stop layer is deposited to overlie the first etch stop layer and the second polycrystalline silicon layer. A reaction is created between the second polycrystalline silicon layer and the layer which is capable of reacting with silicon, typically titanium. A second etch stop layer, resistant to a polycrystalline silicon etch, is formed overlying the poly 2 layer as a result of the reaction. The first etch stop layer functions as a protective layer during the reaction to prohibit a reaction between the poly 1 layer and the layer which is capable of reacting with silicon. The second etch stop layer eliminates trenching and exposure of the substrate even with gross misalignment of the photoresist mask during an etch of the poly 1 to form the interconnect.

In a further embodiment the invention is a semiconductor interconnect for electrically connecting a first region of a substrate and a second region of the substrate. The semiconductor interconnect comprises an electrically conductive silicon plug overlying and in electrical contact with the first region and the second region and an electrically conductive silicon layer, without a silicon interface horizontal to the substrate. The electrically conductive silicon layer is electrically isolated from the substrate and interposed between the silicon plug overlying the first region and the silicon plug overlying the second region. The interface between the silicon plug overlying the first region and the silicon layer is vertical to the substrate as is the interface between the silicon plug overlying the second region and the silicon layer.

BRIEF DESCRIPTION OF THE DRAWINGS

FIGS. 2–12 depict the steps of the invention in cross section.

In FIG. 8 a titanium layer has been deposited to overlie the etch stop layer and second polycrystalline silicon layer of FIG. 5B.

In FIG. 9 an etch stop layer is formed overlying the second polycrystalline silicon layer and the titanium is removed.

In FIG. 10 the etch stop layer of FIG. 2B is removed.

In FIG. 11 a gate region is patterned and the first polycrystalline silicon layer is removed in unmasked regions.

In FIG. 12 the pattern has been removed.

DETAILED DESCRIPTION OF THE INVENTION

The invention is a method for forming an electrical interconnect of polycrystalline silicon overlying a buried contact region of a substrate. The method is depicted in cross section in FIGS. 2–12.

Figure 1A:
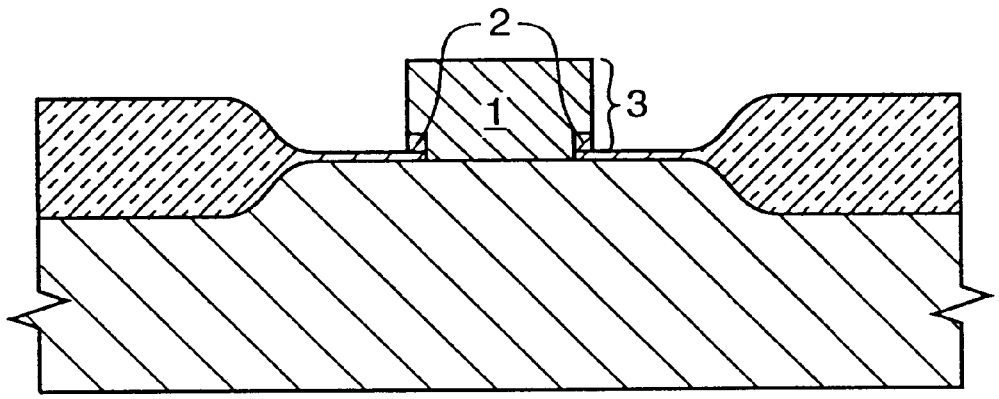
FIGS. 1A and 1B are cross-sectional views of electrical interconnects of the related art.
Figure 1B:
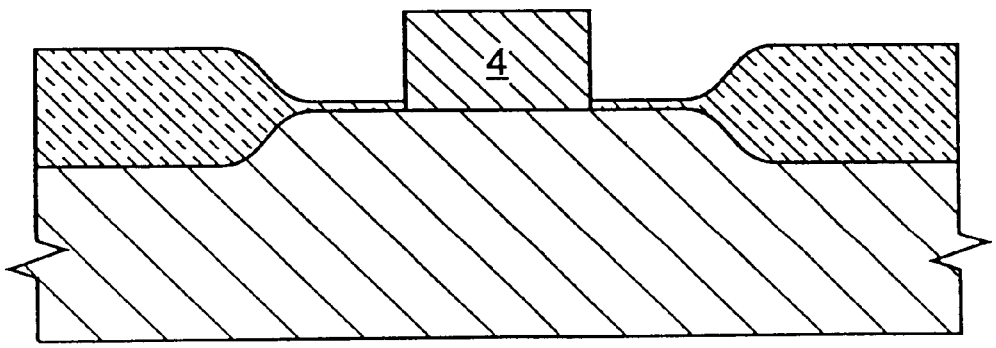
Figure 2A:
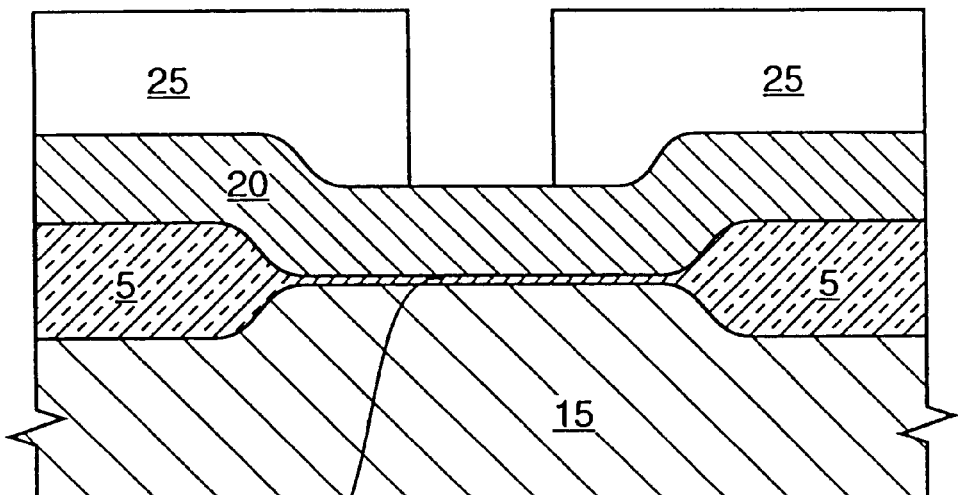
In FIG. 2A a first polycrystalline silicon layer has been deposited to overlie a substrate and has been patterned to define a buried contact region.
Figure 2B:
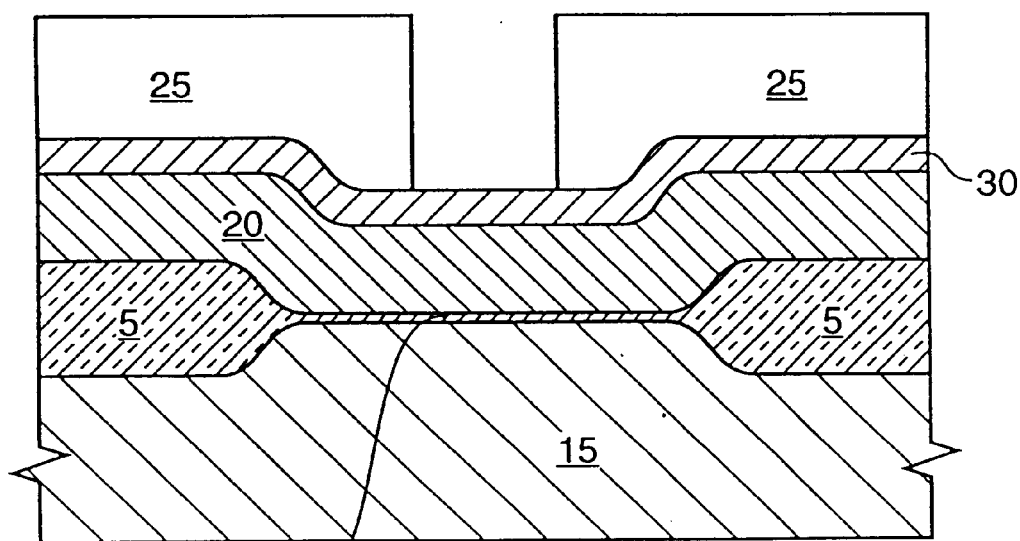
In FIG. 2B a first polycrystalline silicon layer and an etch stop layer have been deposited to overlie a substrate and have been patterned to define a buried contact region.

In the embodiments shown in FIGS. 2A and 2B field oxide regions 5 and a gate oxide layer 10 are formed by conventional methods to overlie a substrate 15. A first polycrystalline silicon layer 20 (poly 1) is deposited to overlie the field oxide regions 5 and gate oxide 10. The thickness of the first polycrystalline silicon layer 20 is selected such that the lowest upper surface of the first polycrystalline silicon layer 20 is higher than the highest upper surface of the field oxide regions 5. The polycrystalline silicon layer 20 is then patterned with photoresist mask 25.

In the second embodiment, shown in FIG. 2B, a polycrystalline silicon etch stop layer 30, also referred to as just etch stop layer 30, is deposited to overlie the first polycrystalline silicon layer 20 prior to patterning with photoresist mask 25. The etch stop layer is irresponsive to a polycrystalline silicon etch. In this embodiment the etch stop layer is oxide although nitride or some other material may also be used.

Figure 3A:
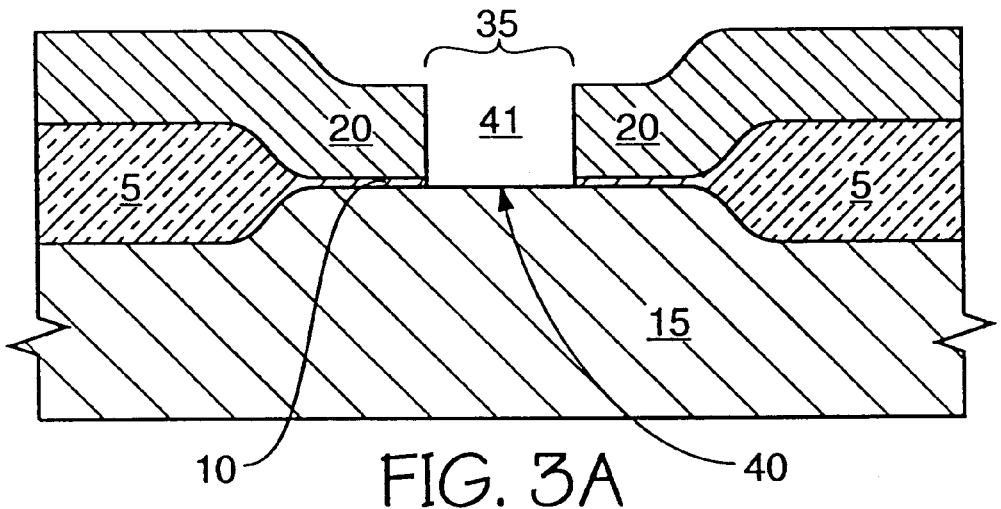
In FIGS. 3A and 3B the substrate has been exposed.
Figure 3B:
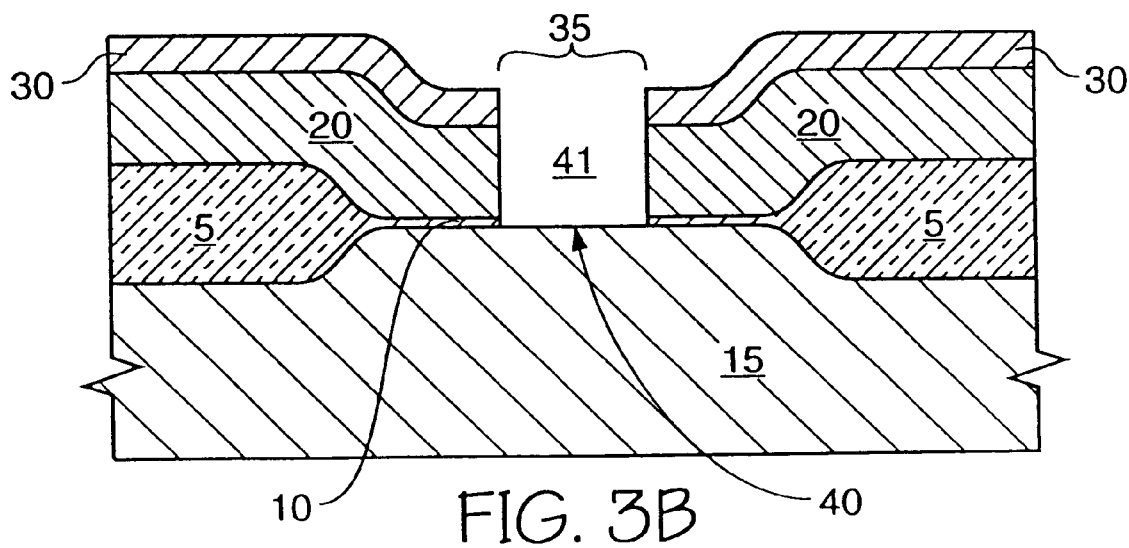

Next the first polycrystalline silicon layer 20 and the gate oxide layer 10 are etched by conventional methods in unmasked region 35 to exposed the buried contact portion 40 of the substrate 15, thereby forming a via 41. This is shown in FIGS. 3A and 3B for the first and the second embodiments respectively. In the second embodiment, see FIG. 3B, a separate etch is conducted prior to the polycrystalline silicon etch to remove the etch stop layer 30 in the unmasked region 35. Subsequent to the formation of via 41 the photoresist mask 25 are removed.

Figure 4A:
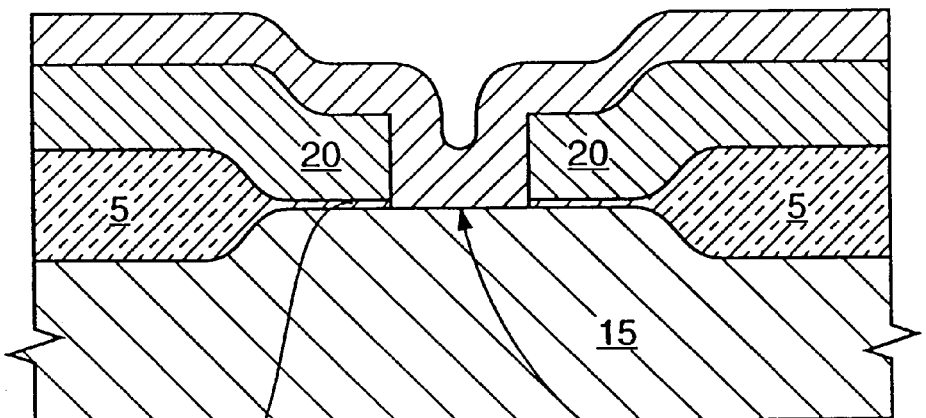
In FIGS. 4A and 4B a second polycrystalline silicon layer has been deposited.
Figure 4B:
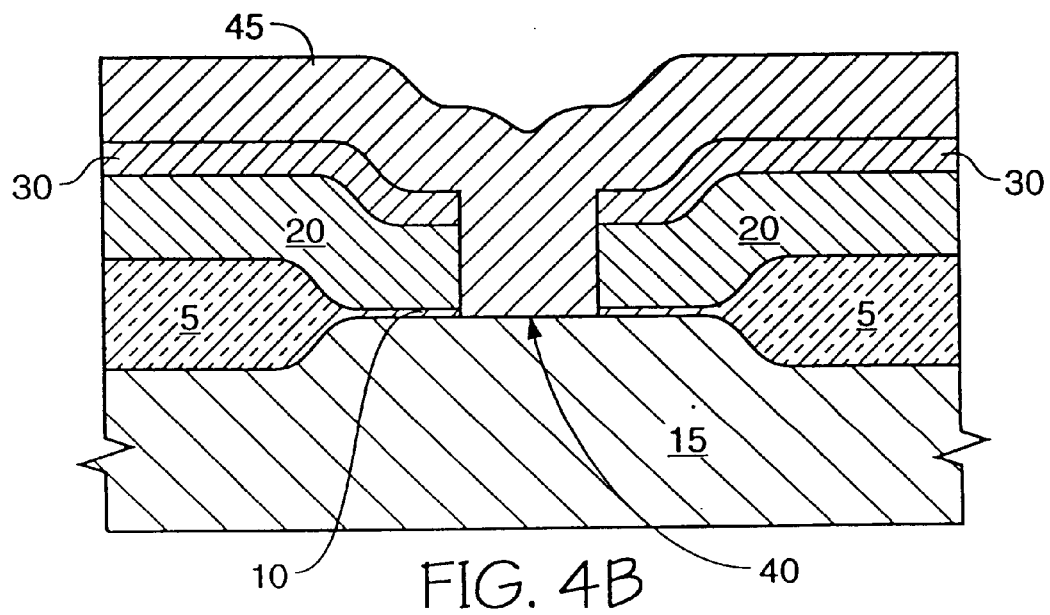

In FIGS. 4A and 4B of the first and second embodiments a second polycrystalline silicon layer 45 (poly 2) is deposited to overlie the first polycrystalline silicon layer 20 and the buried contact portion 40. In the second embodiment the second polycrystalline silicon layer 45 also overlies the etch stop layer 30 and must be thick enough to fill the via 41.

Figure 5A:
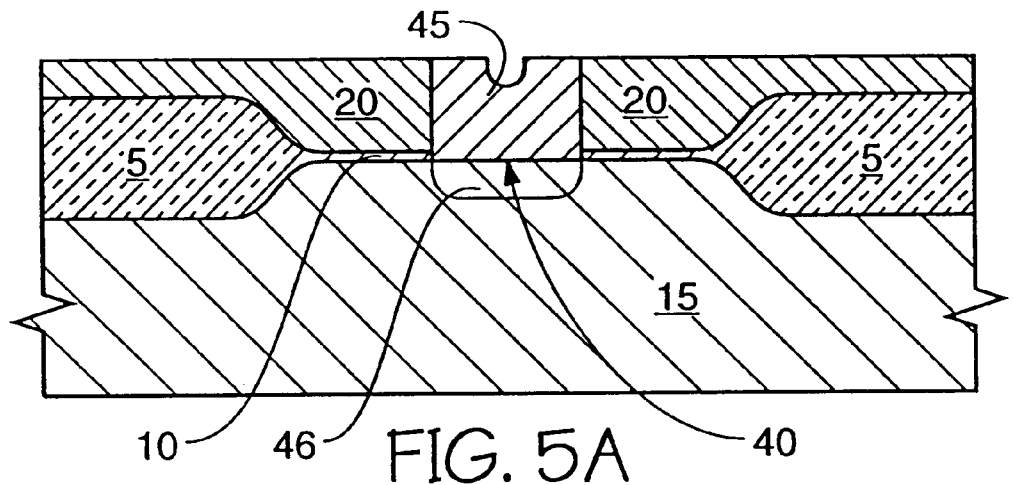
In FIGS. 5A and 5B the second polycrystalline silicon layer has been removed in areas overlying the first polycrystalline silicon layer.

In the first embodiment, see FIG. 5A, a chemical mechanical planarization removes the second polycrystalline silicon 45 overlying the first polycrystalline silicon layer 20 to expose the first polycrystalline silicon layer 20 thereby eliminating a poly 1 and poly 2 horizontal interface. It can be seen that the height of the first polycrystalline layer 20 defines the height of the second polycrystalline silicon layer 45 after the planarization. There may be some loss of the original height of the first polycrystalline layer 20 due to a loss during the chemical mechanical planarization, but it is typically negligible.

Figure 5B:
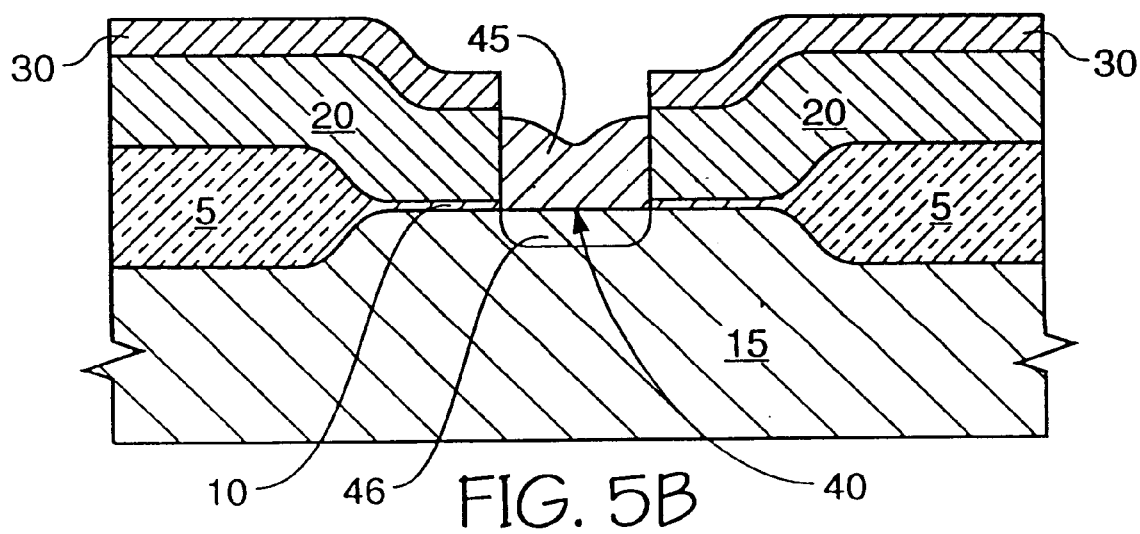

In the second embodiment, see FIG. 5B a polycrystalline silicon etch is used to remove the poly 2 layer 45 overlying the poly 1 layer 20 and etch stop layer 30. In this case it can be seen that the total height of the poly 1 layer 20 and the etch stop layer 30 defines the maximum height of the poly 2 layer 45 after the etch. However, the etch typically consumes additional portions of poly 2 layer 45 such that the upper portion of the poly 2 layer 45 is below the surface of the etch stop layer 30. After removal of the poly 2 layer 45 overlying the poly 1 layer 20 the second polycrystalline silicon layer 45 remaining in via 41 forms a contact plug in electrical contact with buried contact portion 40.

In all of the embodiments the first and second polycrystalline silicon layers are doped to increase conductivity. The preferred doping comprises implanting arsenic and then performing an anneal to diffuse the arsenic. A doped region 46 is created in the buried contact portion 40 of the substrate by diffusion or other means. The doped region 46 typically contacts other diffusion regions in the substrate which are not shown in the present figures but which are well known to those skilled in the art. The exact point or points in the process where doping is performed is subject to manufacturing considerations and is therefore determined at the time of manufacture by a person skilled in the art.

At this junction the method may proceed along two alternate paths to form the contact plug of the invention. FIGS. 6 and 7 represent the first path and FIGS. 8–12 represent the second path.

Figure 6A:
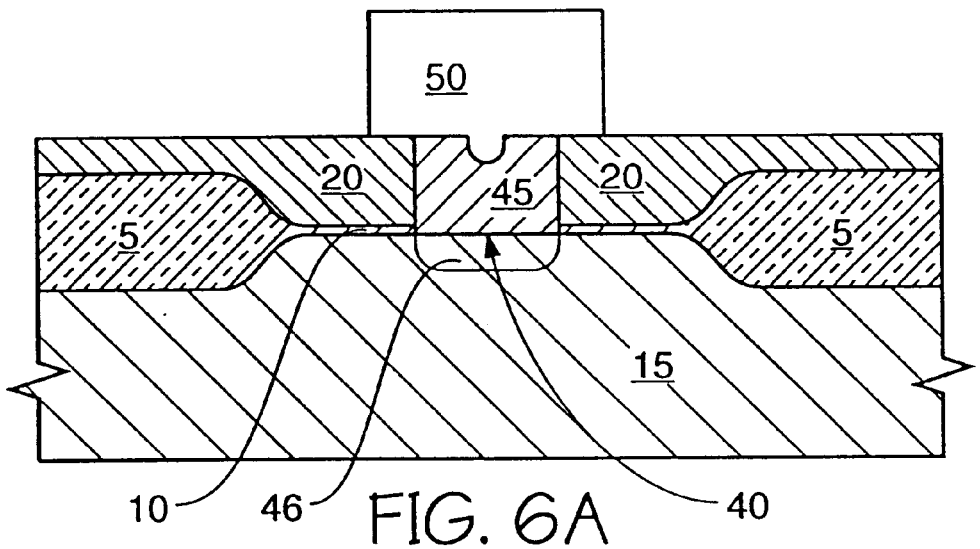
In FIGS. 6A and 6B a gate region has been patterned.
Figure 6B:
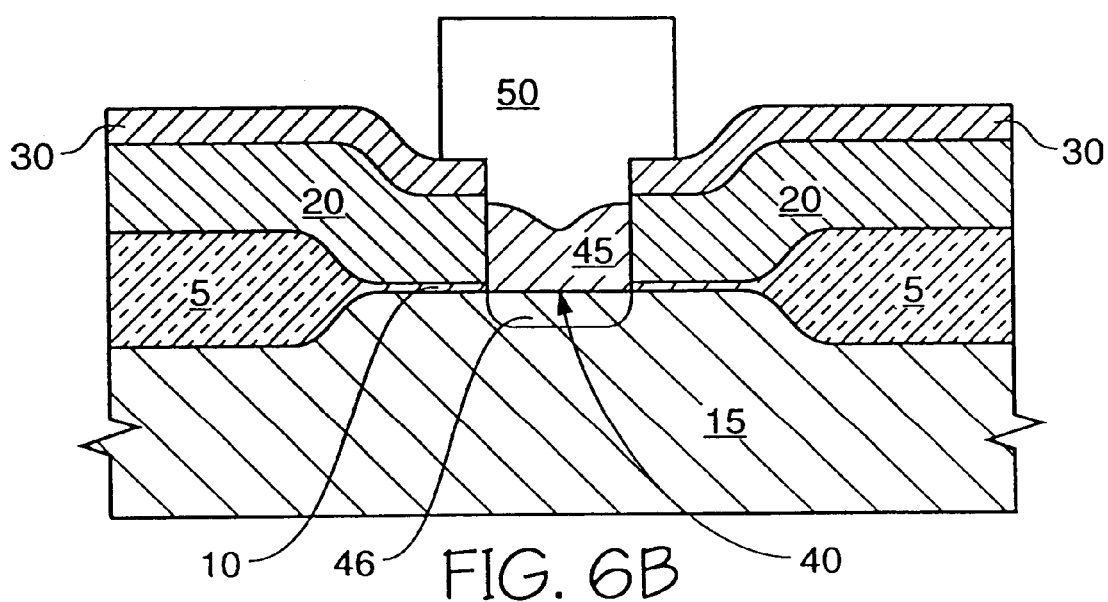

In FIGS. 6A and 6B the first polycrystalline silicon layer 20 is patterned with a photoresist mask 50 to define an electrical interconnect comprising the contact plug of polycrystalline silicon layer 45 and the first polycrystalline silicon layer 20. The electrical interconnect may have different functions and is patterned according to the function desired. In addition to providing electrical access to the buried contact portion 40 the contact plug may form a gate for a field effect transistor or may provide electrical contact to further circuit components. If the photoresist mask 50 is designed to overlap the upper surface of the second poly 2 layer 45 the trenching and exposure of the substrate is eliminated during the etch of the poly 1 layer 20. An optional oxide layer may be deposited to overlie the poly 1 and poly 2 layers 20 and 45 prior to the masking.

Figure 7A:
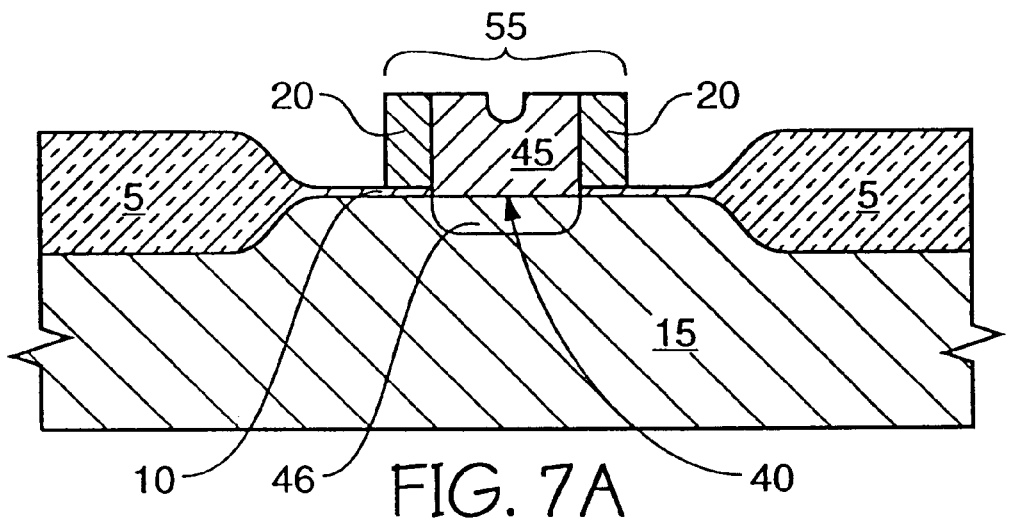
In FIGS. 7A and 7B the first polycrystalline silicon layer has been etched to form the gate region.
Figure 7B:
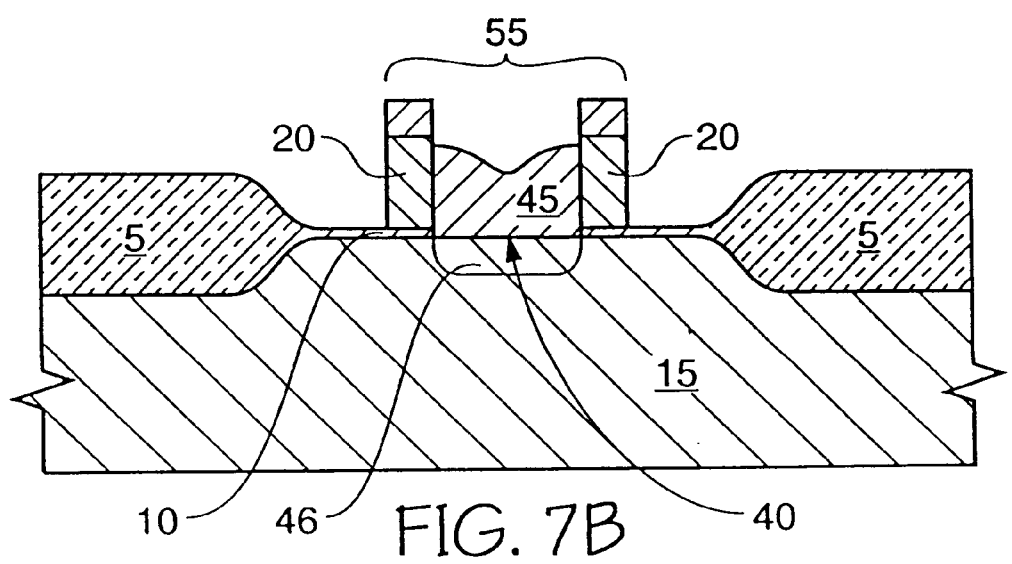

The poly 2 layer 20, and the optional oxide layer when deposited, in FIG. 6A and etch stop layer 30 in FIG. 6B are then etched in exposed areas. The photoresist mask 50 is then removed to form the electrical interconnect 55 comprising the contact plug and polycrystalline silicon layer 20 as shown in FIGS. 7A and 7B for the first and second embodiments, respectively.

Figure 8:
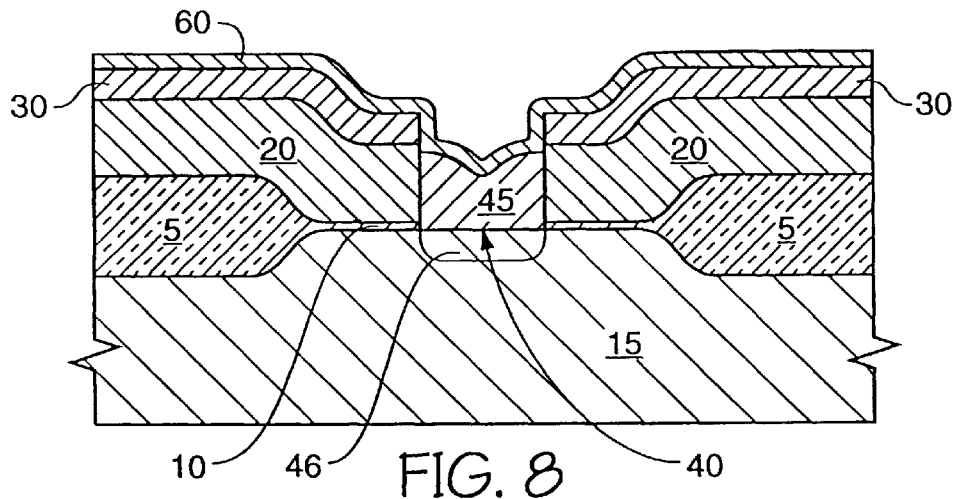
Figure 9:
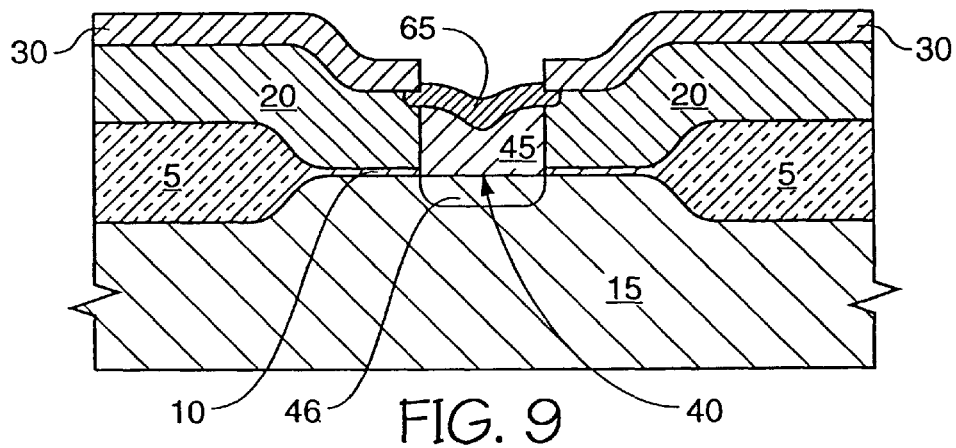

In the second path a titanium layer 60 is deposited to overlie the etch stop layer 30 and the poly 2 layer 45 of FIG. 6B, see FIG. 8.

Next the structure is heated to a temperature conducive to forming titanium silicide. The poly 2 layer 45 reacts with the titanium during heating to form titanium silicide which functions as a silicon etch stop layer 65, see FIG. 9. The nonreacted titanium 60 overlying the etch stop layer 30 is removed following the formation of the titanium silicide 65, also see FIG. 9. The etch stop layer 30 functions as a protective layer prohibiting a reaction between the titanium layer 60 and the poly 1 layer 20 during the reaction of the poly 2 layer 45 with the titanium layer 60.

Optionally, in place of a titanium deposit 60 and subsequent formation of etch stop layer 65 of titanium silicide, oxide may be grown overlying poly 2 layer 45 during an anneal. The result is similar to the structure shown in FIG. 9. However in this case the etch stop layer 30 is nitride and the etch stop layer 65 is oxide.

Figure 10:
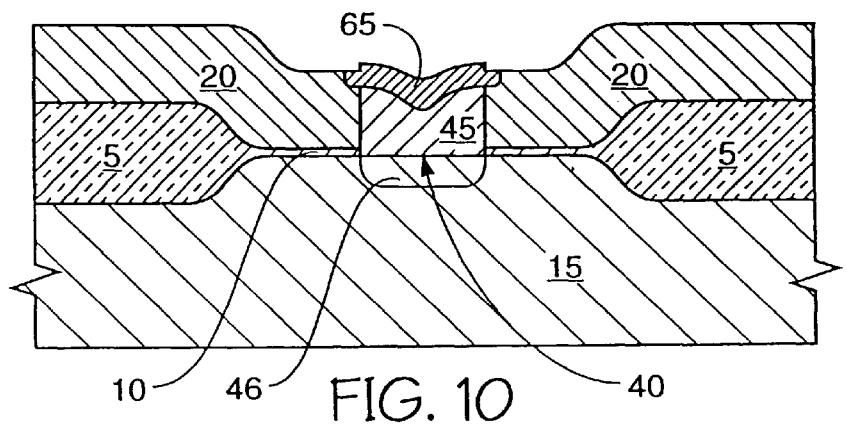

In either case, the etch stop layer 30 may be removed subsequent to the formation of etch stop layer 65, see FIG. 10.

Figure 11:
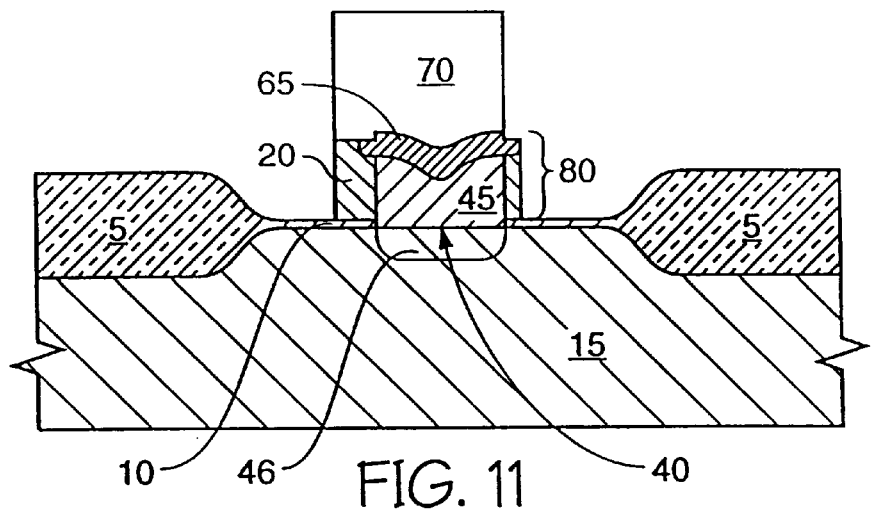
Figure 12:
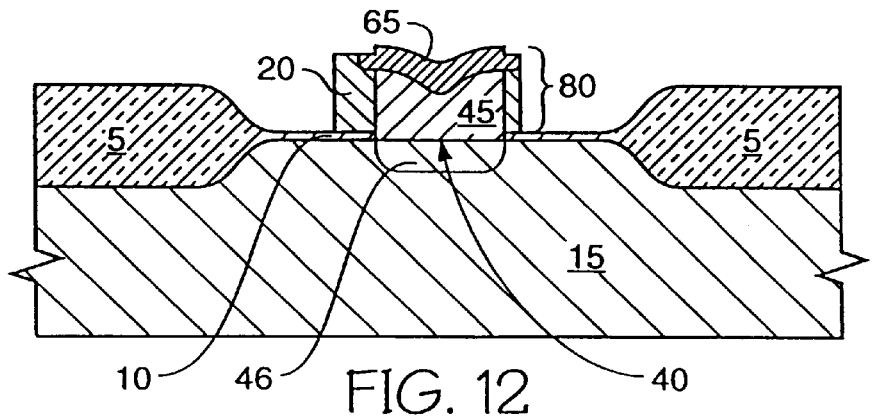

The electrical interconnect is patterned with photoresist mask 70 in FIG. 11. The poly 1 layer 20, and etch stop layer 30 if not already removed, is removed in exposed regions. Since silicon is selectively etchable over the etch stop layer 65 trenching and exposure of the substrate are eliminated during the etch of the poly 1 layer 20 due to the protection afforded the substrate by the etch stop layer 65, either titanium silicide or oxide, during the etch. The etch stop layer 65 is used during the formation of the electrical interconnect 80 to protect the second polycrystalline silicon 45 during the formation of the electrical interconnect 80. The polycrystalline silicon etch is highly selective over titanium silicide or oxide. By using this path of the second embodiment it is possible to eliminate trenching and exposure of the substrate even with gross misalignment of the photoresist mask.

The electrical interconnect 80 and contact plug formed from poly 2 layer 45 are shown following the removal of the photoresist mask 70. Since it was not necessary to use a contact cap to form the interconnect 80 parasitic transistor formation is eliminated. In addition cell size is reduced over methods using a contact cap.

Figure 13:
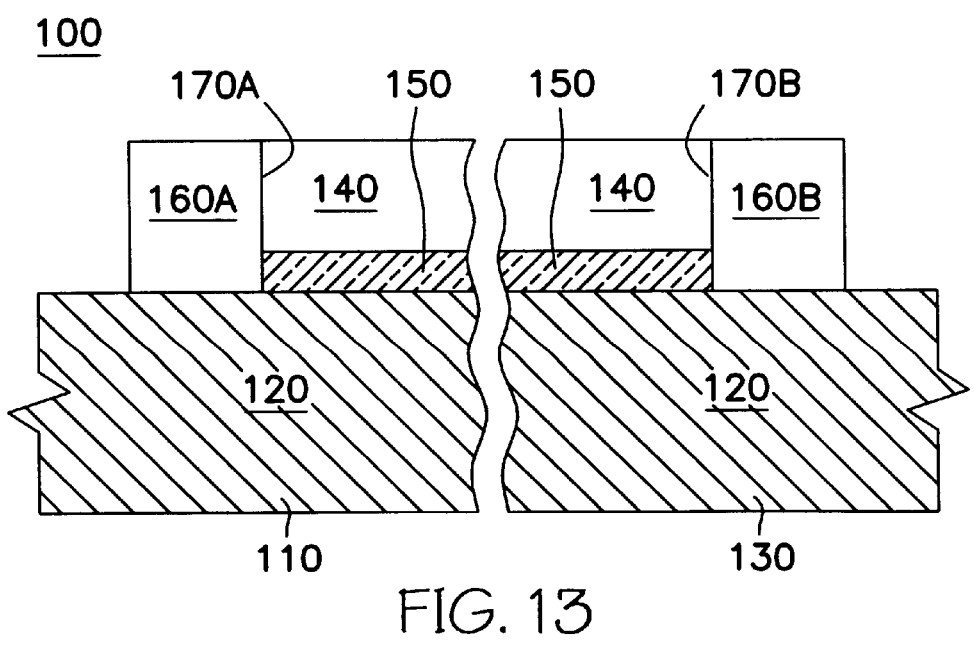
In FIG. 13, an electrical interconnect of the invention is shown.

In a further embodiment shown in FIG. 13, the invention is a semiconductor interconnect 100 for electrically connecting a first region 110 of a substrate 120 and a second region 130 of the substrate 120. The semiconductor interconnect 100 comprises an electrically conductive silicon plug overlying and in electrical contact with the first region 110 and the second region 130 and an electrically conductive silicon layer 140, without a silicon interface horizontal to the substrate 120. The electrically conductive silicon layer 140 is electrically isolated 150 from the substrate 120 and interposed between the silicon plug 160A overlying the first region 110 and the silicon plug 160B overlying the second region 130. The interface 170A between the silicon plug 160A overlying the first region 110 and the silicon layer 140 is vertical to the substrate as is the interface 170B between the silicon plug 160B overlying the second region 130 and the silicon layer 140.

The electrical interconnect formed by the method of the invention may be used in the manufacture of static random access memories (SRAMs) as well as dynamic random access memories.

Although the present invention has been described with reference to particular embodiments, other versions are possible and will be apparent to individuals skilled in the art. The invention therefore, is not limited to the specific features and elements shown. It is intended that the scope of the invention be defined by the appended claims and in accordance with the doctrine of equivalents.

What is claimed is:

1. A semiconductor interconnect, comprising:
    a substrate layer having a first substrate region and a second substrate region;
    a first silicon plug in electrical contact with the first substrate region and extending vertically above the substrate layer;
    a second silicon plug in electrical contact with the second substrate region and extending vertically above the substrate layer;
    an oxide layer overlaying the substrate layer and located between the first and second silicon plugs;
    a first silicon layer capable of electrical conduction overlaying the oxide layer and interposed between the first and second silicon plugs, the first silicon layer has only vertical interfaces with the first and the second silicon plugs; and
    wherein the first and second silicon plugs and the first silicon layer are created by forming a first silicon layer overlying the oxide layer, patterning the first silicon layer to create a masked region and first and second unmasked regions, exposing the substrate layer in the unmasked regions—forming vias in the first silicon and oxide layers, creating a second silicon layer to overlie the first silicon layer and the substrate layer—the second silicon layer electrically contacting the substrate layer in the unmasked regions, removing the second silicon layer from overlying the first silicon layer—portions of the second silicon layer remaining in the vias and contacting the substrate layer to form the first and second silicon plugs—the silicon plugs and the first silicon layer forming the semiconductor interconnect.

2. The semiconductor interconnect of claim 1, wherein the silicon plugs having a height level with a top surface of the first silicon layer.

3. The semiconductor interconnect of claim 1 wherein removing comprises etching the second silicon layer.

4. The semiconductor interconnect of claim 1 wherein removing comprises performing a planarization of the second silicon layer to expose the first silicon layer.

5. The semiconductor interconnect of claim 4 wherein the planarization includes chemical-mechanical planarization.

6. The semiconductor interconnect of claim 1 further comprising:
    protecting at least the second silicon layer with a photoresist mask; and
    removing exposed portions of the first silicon layer, remaining portions of the first silicon layer vertically and electrically contacting the silicon plugs.

7. The semiconductor interconnect of claim 6 further comprising creating a protective layer overlying the second silicon layer remaining subsequent to removing the second silicon layer, the protective layer protecting the second silicon layer during removing exposed portions of the first silicon layer.

8. The semiconductor interconnect of claim 1, further comprising doping the first and second silicon layers to increase conductivity.

9. A semiconductor interconnect, comprising:
    a substrate layer having a first substrate region and a second substrate region;
    a first silicon plug in electrical contact with the first substrate region and extending vertically above the substrate layer;
    a second silicon plug in electrical contact with the second substrate region and extending vertically above the substrate layer;
    an oxide layer overlaying the substrate layer and located between the first and second silicon plugs;
    a first silicon layer capable of electrical conduction overlaying the oxide layer and interposed between the first and second silicon plugs, the first silicon layer has only vertical interfaces with the first and the second silicon plugs; and
    wherein the first and second silicon plugs and the first silicon layer are created by forming a first silicon layer overlying the oxide layer, creating an etch stop layer overlying the first silicon layer, patterning the first silicon layer and the etch stop layer to create a masked region and first and second unmasked regions, exposing the substrate layer in the unmasked regions—forming vias in the first silicon layer, oxide layer and the etch stop layer, creating a second silicon layer to overlie the etch stop layer and the substrate layer—the second silicon layer electrically contacting the substrate layer in the unmasked regions, removing the second silicon layer from overlying the etch stop layer—portions of the second silicon layer remaining in the vias and contacting the substrate layer to form the first and second silicon plugs—the silicon plugs and the first silicon layer forming the semiconductor interconnect.

10. The semiconductor interconnect of claim 9, wherein a maximum height of the silicon plugs is determined by a total height of the first silicon layer and the etch stop layer, such that the height of the silicon plugs is equal to or less than the total height of the first silicon layer and the etch stop layer.

11. The semiconductor interconnect of claim 9, wherein exposing comprises etching the first silicon layer and the etch stop layer.

12. The semiconductor interconnect of claim 9, wherein removing comprises etching the second silicon layer, the etch stop layer protecting the first silicon layer during removing.

13. A semiconductor interconnect, comprising:
a substrate layer having a first substrate region and a second substrate region;
a first silicon plug in electrical contact with the first substrate region and extending vertically above the substrate layer;
a second silicon plug in electrical contact with the second substrate region and extending vertically above the substrate layer;
an oxide layer overlaying the substrate layer and located between the first and second silicon plugs;
a first silicon layer capable of electrical conduction overlaying the oxide layer and interposed between the first and second silicon plugs, the first silicon layer has only vertical interfaces with the first and the second silicon plugs; and
wherein the first and second silicon plugs and the first silicon layer are created by forming a first silicon layer overlying the oxide layer, creating a first etch stop layer overlying the first silicon layer; patterning the first silicon layer and the etch stop layer to create a masked region and first and second unmasked regions, forming vias in the first silicon layer, oxide layer and the etch stop layer, creating a second silicon layer to overlie the etch stop layer and the substrate layer—the second silicon layer electrically contacting the substrate layer in the unmasked regions, removing the second silicon layer from overlying the etch stop layer—portions of the second silicon layer remaining in the vias and contacting the substrate layer to form the first and second silicon plugs, creating a reacting layer which is capable of reacting with the second silicon layer to form a layer irresponsive to an etchant which is capable of etching the second silicon layer—the reacting layer overlying the first etch stop layer and the first and second silicon plugs, creating a reaction between the reacting layer and the second silicon layer to form a second etch stop layer overlying the first and second silicon plugs, the first etch stop layer protecting the first silicon layer from reacting with the reacting layer during creating the reaction, removing unreacted portions of the reacting layer, removing at least portions of the first etch stop layer while retaining the second etch stop layer, removing at least portions of the first silicon layer to further define a shape of the semiconductor interconnect, and retaining the first and second silicon plugs in their entirety during removing portions of the first etch stop layer and the first silicon layer.

14. A semiconductor interconnect, comprising:
a substrate layer having a first substrate region and a second substrate region;
a first silicon plug in electrical contact with the first substrate region and extending vertically above the substrate layer;
a second silicon plug in electrical contact with the second substrate region and extending vertically above the substrate layer;
an oxide layer overlaying the substrate layer and located between the first and second silicon plugs;
a first silicon layer capable of electrical conduction overlaying the oxide layer and interposed between the first and second silicon plugs, the first silicon layer has only vertical interfaces with the first and the second silicon plugs; and
wherein the first and second silicon plugs and the first silicon layer are created by forming the first silicon layer overlying the oxide layer, creating an etch stop layer overlying the first silicon layer, patterning the first silicon layer and the etch stop layer to create a masked region and first and second unmasked regions, exposing the substrate in the unmasked regions—forming vias having sidewalls comprising the first silicon layer, the etch stop layer and the oxide layer, creating the second silicon layer to overlie the etch stop layer and the substrate—the second silicon layer electrically contacting the substrate in the unmasked regions and etching a portion of the second silicon layer to expose the etch stop layer—at least a portion of the second silicon layer remaining in electrical contact with the substrate to form the first and second plugs of the semiconductor interconnect.

15. The semiconductor interconnect of claim 14, wherein the etch stop layer is a first etch stop layer and further comprising:
creating, overlying the first etch stop layer and the silicon plugs, a reacting layer which is capable of reacting with the second silicon layer to form a second etch stop layer which is irresponsive to an etchant which is capable of etching the second silicon layer;
creating a reaction between the reacting layer and the silicon plugs to form the second etch stop layer overlying the silicon plugs, the first etch stop layer protecting the first silicon layer from reacting with the reacting layer during creating the reaction;
removing unreacted portions of the reacting layer;
removing at least portions of the first etch stop layer while retaining the second etch stop layer; and
removing at least portions of the first silicon layer, while retaining the silicon plugs in their entirety during removing portions of the first etch stop layer and the first silicon layer to form the semiconductor interconnect of the silicon plugs and the remaining portion of the first silicon layer.

16. The semiconductor interconnect of claim 14, further comprising forming a protective layer overlying the silicon plugs, the protective layer protecting the silicon plugs during subsequent etching of the first silicon layer.

17. The semiconductor interconnect of claim 14, further comprising:
   depositing a titanium layer overlying the etch stop layer and the silicon plugs; and
   forming a layer of titanium silicide overlying the silicon plugs.

18. The semiconductor interconnect of claim 17, further comprising:
   removing at least portions of the first silicon layer; and
   retaining the silicon plugs in their entirety during removing.

19. The semiconductor interconnect of claim 14, wherein exposing comprises:
   etching the etch stop layer; and
   etching the first silicon layer.

20. A semiconductor memory device, comprising:
   multiple semiconductor devices wherein at least two semiconductor devices electrically connected by a semiconductor interconnect comprising:
      a substrate layer having a first substrate region and a second substrate region;
      a first silicon plug in electrical contact with the first substrate region and extending vertically above the substrate layer;
      a second silicon plug in electrical contact with the second substrate region and extending vertically above the substrate layer;
      an oxide layer overlaying the substrate layer and located between the first and second silicon plugs;
      a first silicon layer capable of electrical conduction overlaying the oxide layer and interposed between the first and second silicon plugs, the first silicon layer has only vertical interfaces with the first and the second silicon plugs; and
      wherein the first and second silicon plugs and the first silicon layer are created by forming a first silicon layer overlying the oxide layer, patterning the first silicon layer to create a masked region and first and second unmasked regions, exposing the substrate layer in the unmasked regions—forming vias in the first silicon and oxide layers, creating a second silicon layer to overlie the first silicon layer and the substrate layer—the second silicon layer electrically contacting the substrate layer in the unmasked regions, removing the second silicon layer from overlying the first silicon layer—portions of the second silicon layer remaining in the vias and contacting the substrate layer to form the first and second silicon plugs—the silicon plugs and the first silicon layer forming the semiconductor interconnect.

21. A semiconductor memory device, comprising:
   multiple semiconductor devices wherein at least two semiconductor devices electrically connected by a semiconductor interconnect comprising:
      a substrate layer having a first substrate region and a second substrate region;
      a first silicon plug in electrical contact with the first substrate region and extending vertically above the substrate layer;
      a second silicon plug in electrical contact with the second substrate region and extending vertically above the substrate layer;
      an oxide layer overlaying the substrate layer and located between the first and second silicon plugs;
      a first silicon layer capable of electrical conduction overlaying the oxide layer and interposed between the first and second silicon plugs, the first silicon layer has only vertical interfaces with the first and the second silicon plugs; and
      wherein the first and second silicon plugs and the first silicon layer are created by forming a first silicon layer overlying the oxide layer, creating an etch stop layer overlying the first silicon layer, patterning the first silicon layer and the etch stop layer to create a masked region and first and second unmasked regions, exposing the substrate layer in the unmasked regions—forming vias in the first silicon layer, oxide layer and the etch stop layer, creating a second silicon layer to overlie the etch stop layer and the substrate layer—the second silicon layer electrically contacting the substrate layer in the unmasked regions, removing the second silicon layer from overlying the etch stop layer—portions of the second silicon layer remaining in the vias and contacting the substrate layer to form the first and second silicon plugs—the silicon plugs and the first silicon layer forming the semiconductor interconnect.

22. A computer system, comprising:
   a central processing unit; and
   a semiconductor memory device, comprising:
      multiple semiconductor devices wherein at least two semiconductor devices electrically connected by a semiconductor interconnect comprising:
         a substrate layer having a first substrate region and a second substrate region;
         a first silicon plug in electrical contact with the first substrate region and extending vertically above the substrate layer;
         a second silicon plug in electrical contact with the second substrate region and extending vertically above the substrate layer;
         an oxide layer overlaying the substrate layer and located between the first and second silicon plugs;
         a first silicon layer capable of electrical conduction overlaying the oxide layer and interposed between the first and second silicon plugs, the first silicon layer has only vertical interfaces with the first and the second silicon plugs; and
         wherein the first and second silicon plugs and the first silicon layer are created by forming a first silicon layer overlying the oxide layer, patterning the first silicon layer to create a masked region and first and second unmasked regions, exposing the substrate layer in the unmasked regions—forming vias in the first silicon and oxide layers, creating a second silicon layer to overlie the first silicon layer and the substrate layer—the second silicon layer electrically contacting the substrate layer in the unmasked regions, removing the second silicon layer from overlying the first silicon layer—portions of the second silicon layer remaining in the vias and contacting the substrate layer to form the first and second silicon plugs—the silicon plugs and the first silicon layer forming the semiconductor interconnect.

23. A computer system, comprising:
   a central processing unit; and
   a semiconductor memory device, comprising:
      multiple semiconductor devices wherein at least two semiconductor devices electrically connected by a semiconductor interconnect comprising:
         a substrate layer having a first substrate region and a second substrate region;

a first silicon plug in electrical contact with the first substrate region and extending vertically above the substrate layer;

a second silicon plug in electrical contact with the second substrate region and extending vertically above the substrate layer;

an oxide layer overlaying the substrate layer and located between the first and second silicon plugs;

a first silicon layer capable of electrical conduction overlaying the oxide layer and interposed between the first and second silicon plugs, the first silicon layer has only vertical interfaces with the first and the second silicon plugs; and wherein the first and second silicon plugs and the first silicon layer are created by forming a first silicon layer overlying the oxide layer, creating an etch stop layer overlying the first silicon layer, patterning the first silicon layer and the etch stop layer to create a masked region and first and second unmasked regions, exposing the substrate layer in the unmasked regions—forming vias in the first silicon layer, oxide layer and the etch stop layer, creating a second silicon layer to overlie the etch stop layer and the substrate layer—the second silicon layer electrically contacting the substrate layer in the unmasked regions, removing the second silicon layer from overlying the etch stop layer—portions of the second silicon layer remaining in the vias and contacting the substrate layer to form the first and second silicon plugs—the silicon plugs and the first silicon layer forming the semiconductor interconnect.

* * * * *